United States Patent [19]

Pankove

[11] 4,224,084
[45] Sep. 23, 1980

[54] METHOD AND STRUCTURE FOR PASSIVATING A SEMICONDUCTOR DEVICE

[75] Inventor: Jacques I. Pankove, Princeton, N.J.

[73] Assignee: RCA Corporation, New York, N.Y.

[21] Appl. No.: 30,704

[22] Filed: Apr. 16, 1979

[51] Int. Cl.² .................. H01L 21/26; H01L 21/265
[52] U.S. Cl. ........................................ 148/1.5; 357/2; 357/91
[58] Field of Search ................... 148/1.5; 357/2, 91

[56] References Cited

U.S. PATENT DOCUMENTS

| | | | |
|---|---|---|---|
| 3,390,011 | 6/1968 | Brown et al. | 117/201 |
| 3,859,127 | 1/1975 | Lehner | 117/212 |
| 3,943,014 | 3/1976 | Yoshizawa | 148/187 |
| 4,013,485 | 3/1977 | Ma et al. | 148/1.5 |
| 4,113,514 | 9/1978 | Pankove et al. | 148/1.5 |

OTHER PUBLICATIONS

Malhotra et al., "Effects of H . . . in Amorphous Si", Appl. Phys. Letts. 28, (1976), 47.
Brodsky et al., "Hydrogenation . . . S/C Devices . . . ", IBM-TDB, 20 (Apr. 1978), 4962.
Csepregi et al., "Reordering–Amorphous Layers . . . ", Jour. Appl. Phys. 48, (1977), 4234.
Bourgoin et al., ". . . Amorphous Layer . . . in Si . . . ", Rad. Effects, 22, (1974), 205.
Golanski et al., ". . . Si Bombarded . . . Si++Ions", Rad. Effects, 25, (1975), 213.
Beanland, ". . . B Molecular Implants into Si", in Ion Implantations in S/C, 1976 ed. Chernov et al., Plenum, p. 31.
Johansen et al., ". . . Si . . . Bombardment with Ne+ & P+ Ions", Rad. Effects 2, (1969), p. 19.
Appelbaum et al., "Hydrogen . . . on Si . . . ", Phys. Rev. Letts., 39, (1977), 1487.
Pankove et al., ". . . Hydrogenated Amorphous Si", Appl. Phys. Letts., 31, (1977), 450.
Yasaitis, "Ion–Implantation . . . Amorphous Isolation", Electronics Letts., 14, (Jul. 1978), 460.
Tokuyama et al., ". . . Disorders in . . . Implanted Si", Jap. Jour. Appl. Phys., 17, (Aug. 1978), 1301.
Gerasimenko et al., "Inhomogeneity . . . Amorphous Layer . . . ", Sov. Phys. Semicond., 11, (1977), 108.
Hofker et al., ". . . B Implantations in Amorphous . . . Si", Rad. Effects, 24, (1975), 223.

*Primary Examiner*—L. Dewayne Rutledge
*Assistant Examiner*—Upendra Roy
*Attorney, Agent, or Firm*—B. E. Morris; D. S. Cohen; T. H. Magee

[57] ABSTRACT

A method of passivating a silicon semiconductor device having at least one active component disposed in a crystalline region thereof comprises the steps of bombarding a surface of the crystalline region with ions to convert a part of the region adjacent the surface into an amorphous layer of graded crystallinity, and then exposing the amorphous layer to atomic hydrogen, whereby an integral layer of hydrogenated amorphous silicon is formed adjacent the crystalline region.

12 Claims, 2 Drawing Figures

METHOD AND STRUCTURE FOR PASSIVATING A SEMICONDUCTOR DEVICE

This invention relates to a method and structure for passivating a semiconductor device in order to reduce the undesirable effects of recombination/generation centers on the active components of the device.

The operating performance of a semiconductor device having active components disposed therein is frequently degraded by the removal of charge carriers needed for the operation of the device, and by the generation of unwanted charger carriers, thereby increasing power dissipation and noise. From the early history of germanium and silicon single-crystal semiconductor physics, it is known that such semiconductor material contains dangling bonds which are potent minority-carrier lifetime killers. These dangling bonds are responsible for states in the energy gap which, depending on the applied bias, either remove the charge carriers needed for the operation of the device or generate unwanted charge carriers. Dangling bonds occur primarily at the surface of the device and are responsible for the so-called "surface recombination". Dangling bonds also occur at vacancies, micropores, dislocations, and are associated with certain impurities.

It is known that the formation of amorphous silicon (a-Si) by the glow-discharge decomposition of silane results in a hydrogen-rich material. A method of depositing a body of amorphous silicon on a substrate in a glow-discharge apparatus is described in U.S. Pat. No. 4,064,521, which issued to D. E. Carlson on Dec. 20, 1977 and is assigned to RCA Corporation. It has been shown by J. I. Pankove and D. E. Carlson in Appl. Phys. Letters 31, (1977), 450 that a-Si produced by the glow-discharge decomposition of silane may contain approximately 18 to 50 atomic percent of hydrogen. Most of this hydrogen is believed to be valencebonded to silicon atoms in the amorphous network as Si-H bonds. Heating the H-doped a-Si in vacuum causes a measureable evolution of hydrogen. When a-Si:H is thermally dehydrogenated, the residue is in the form of Si which is extremely rich in dangling bonds. The dangling bonds left in the material by the outgassing of hydrogen are effective sites for non-radiative recombination, as they are in single-crystal Si.

A method of passivating a semiconductor device is described in U.S. Pat. No. 4,113,514, which issued to M. A. Lampert and myself on Sept. 12, 1978 and is assigned to RCA Corporation. This method comprises exposing the semiconductor device to atomic hydrogen at a temperature lower than about 450° C.; subsequently, such a device must be kept below this dehydrogenation temperature, otherwise the hydrogen escapes the dangling bonds. I have also reported that a technique for passivating a PN junction adjacent a surface of a semiconductor substrate comprises coating the area of the surface adjacent the PN junction with a layer of hydrogenated amorphous silicon (a-Si:H) containing between about 5 and about 50 atomic percent of hydrogen. Such a layer is produced by the glow discharge dissociation of silane (SiH$_4$). However, upon heating, such layers of a-Si:H can blister and flake off, thus exposing the crystalline silicon to the ambient.

The present invention provides a technique for neutralizing the dangling bonds in a semiconductor device, thereby passivating the device by reducing the number of recombination/generation centers in the device. This technique provides for an adherent passivant which withstands heating up to 700° C.

Figure 1:
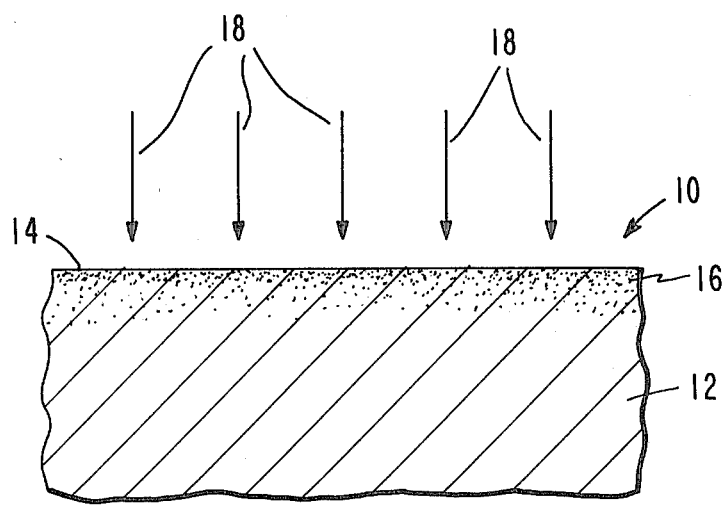
FIG. 1 is a partial cross-sectional view of a portion of a silicon wafer illustrating the method of the present invention.

Referring to FIG. 1 of the drawings, there is shown a semiconductor device 10 having at least one active component (not shown) disposed in a crystalline region 12 thereof. An active component refers to an active element within the device 10 which exhibits transistance, i.e., a capability of controlling voltages or currents so as to produce gain or switching action in a circuit, such as amplification or rectification. In other words, the semiconductor device 10 has an active component therein, such as a Shottky barrier, PN junction diode, transistor, or thyristor, whose performance would be degraded by the removal of needed charge carriers or by the generation of unwanted charge carriers, and thus, whose passivation thereof would have a beneficial effect on the operating performance of the device 10. In the present example, the crystalline region 12 comprises a portion of a silicon wafer.

In carrying out the present passivation method, a part of the crystalline region 12 adjacent a surface 14 thereof is converted into an amorphous layer 16 of graded crystallinity. Preferably, the surface 14 of the crystalline region 12 is bombarded with particles having sufficient energy to convert a part of the region adjacent the surface 14 into the amorphous layer 16 of graded crystallinity. In the present embodiment, this bombarding step is performed by subjecting the surface 14 to a beam of Si$^{28}$ ions, illustrated by arrows 18 in FIG. 1, to provide an implantation dose amounting to $5 \times 10^{15}$ atoms/cm$^2$ through the surface 14. The ions are generated within a conventional ion implantation system (not shown) and may have an energy in the range of 10 to 300 Kev. In the present example, an energy of 240 Kev was utilized; such a bombardment causes the amorphization to extend about 0.2 $\mu$m below the surface 14. The thickness of the amorphous layer 16 may vary between about 0.01 $\mu$m and about 0.2 $\mu$m depending on the energy and mass of the bombarding particles. The purpose of the bombarding particles is to convert the top part of the crystalline region 12 adjacent the surface 14 into the amorphous layer 16 of gradually increasing crystallinity away from the surface 14. Although ion implantation is utilized in the present embodiment to create the layer 16 of graded disorder, any other type of particle bombardment may be utilized, including the use of an electron beam.

The amorphous layer 16 is then exposed to atomic hydrogen, whereby an integral layer of hydrogenated amorphous silicon is formed adjacent the crystalline region 12. In the preferred embodiment, the exposing step is performed by subjecting molecular hydrogen gas (H$_2$) to a glow discharge within a chamber at a pressure below about 5 torr and at a temperature lower than about 450° C. The exposure to the atomic hydrogen may last from a few minutes to several hours. In the present example, I exposed the amorphous layer 16 for one hour at 300° C. For more detailed information on exposing a device to atomic hydrogen, see U.S. Pat. No. 4,113,514 issued to Pankove et al. on Sept. 12, 1978 and assigned to RCA Corporation, which is incorporated herein by reference.

Figure 2:
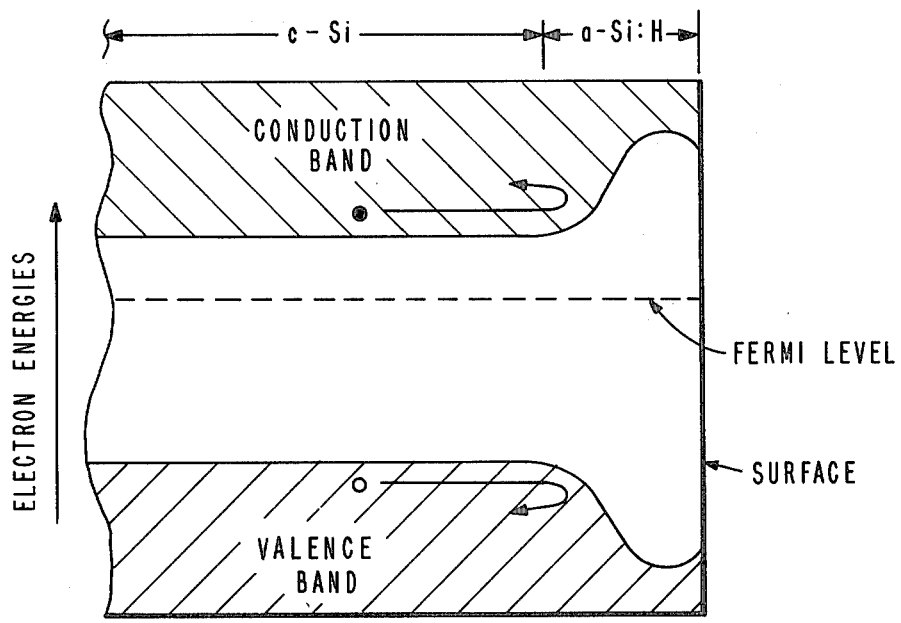
FIG. 2 is a diagrammatic view of a cross-sectional, energy level diagram of the region adjacent the surface of a structure made in accordance with the present invention.

The exposure to the atomic hydrogen neutralizes the dangling bonds existing in the semiconductor device by attaching a hydrogen atom to each dangling bond. The hydrogen atoms penetrate the amorphized layer 16 and tie the dangling bonds by bonding to a dangling orbital at each surface Si atom to form a hydride (Si:H, Si:H$_2$ or Si:H$_3$) inducing a wider energy gap. As a result of this energy gap expansion, illustrated in FIG. 2, barriers are formed in the amorphized layer 16 to both electrons and holes to prevent their access to the surface 14. I have conducted tests which show that such amorphized layers contain between about 5 and about 50 atomic percent of hydrogen. Consequently, a hydrogenated amorphous silicon layer means an amorphous layer which contains a significant amount of hydrogen therein. A consequence of this passivation is that the electrons and holes acquire a longer lifetime, which is beneficial to improving the operating performance of the device 10.

I have discovered that amorphization of crystalline silicon to form the layer 16 of graded disorder followed by hydrogenation of this amorphous layer 16 provides a strongly adherent passivating layer which repels electrons and holes from the surface 14 of the device 10. The ion implantation step introduces damage, the nature of which is not fully understood at the present time. It is believed that the lattice disorder in the amorphized layer 16 presents a structure which is capable of creating a stronger bond with the atomic hydrogen, resulting in a significant reduction in hydrogen evolution when the device is heated to higher temperatures of the order of 500° C.

It is also critical that the layer 16 be an integral layer of graded crystallinity. As illustrated by the dots in FIG. 1, the density of which indicates the degree of damage or disorder in the lattice structure, the layer 16 has a gradually decreasing crystallinity away from the crystalline region 12; in other words, the disorder decreases away from the surface 14. This graded disorder is achieved by converting a part of the crystalline region 12 adjacent the surface 14 into the amorphous layer 16, as contrasted with depositing a separate amorphous layer adjacent the surface of the region 12. The disorder is graded from amorphous (or partly amorphous) at the surface 14 to crystalline below the surface 14, and occurs over a distance of about 0.01 μm to 0.2 μm. By creating this graded amorphous layer 16 which blends gradually into the crystalline region 12, and thus has no distinct boundary line separating it from the crystalline region 12, I have found that such a structure may be heated to significantly higher temperatures without the formation of any blisters and the subsequent flaking off. I have heated samples prepared according to the present novel technique to temperatures in the range of 680° C. to 700° C. without observing any blistering.

The present novel passivating technique is applicable to any semiconductor device where it is desired to effectively neutralize dangling bonds to the extent that they do not degrade the performance of active semiconductor components by removing needed charge carriers or by generating unwanted charge carriers. The hydrogenated amorphous layer at the surface of the device 10 may be continuous or may cover only preselected portions of the surface 14. In addition, doping of the amorphous layer 16 can be accomplished during the bombarding step by using the appropriate ions.

What is claimed is:

1. A method of passivating a semiconductor device having at least one active component disposed in a crystalline region thereof comprising the steps of:
   converting a part of said region adjacent a surface of said crystalline region into an amorphous layer of graded crystallinity, and
   exposing said amorphous layer to atomic hydrogen, whereby an integral layer of hydrogenated amorphous semiconductor material is formed adjacent said crystalline region.

2. A method as recited in claim 1 wherein said converting step is performed by bombarding said surface with particles having sufficient energy to convert said part of said region into the amorphous layer of graded crystallinity.

3. A method as recited in claim 2 wherein said bombarding step is performed by subjecting said surface to a beam of ions having an energy in the range of 10 to 300 Kev.

4. A method as recited in claim 1 wherein said exposing step is performed by subjecting molecular hydrogen gas (H$_2$) to a glow discharge within a chamber at a pressure below about 5 torr and at a temperature lower than about 450° C.

5. A method as recited in claim 4 wherein said exposing step is performed for approximately one hour at 300° C.

6. A method as recited in claim 1 wherein said semiconductor device comprises a silicon wafer and wherein the integral layer of hydrogenated amorphous silicon contains between about 5 and about 50 atomic percent of hydrogen.

7. A method as recited in claim 6 wherein said integral layer of hydrogenated amorphous silicon has a thickness between about 0.01 μm and about 0.2 μm.

8. In a semiconductor device having at least one active component disposed in a crystalline region thereof, the improvement comprising an integral layer of hydrogenated amorphous semiconductor material adjacent said crystalline region, said layer having a gradually decreasing crystallinity away from said crystalline region.

9. A semiconductor device as defined in claim 8 wherein said device comprises a silicon wafer and wherein the integral layer of hydrogenated amorphous silicon contains between about 5 and about 50 atomic percent of hydrogen.

10. A semiconductor device as defined in claim 9 wherein said integral layer of hydrogenated amorphous silicon has a thickness between about 0.01 μm and about 0.2 μm.

11. A semiconductor device as defined in claim 10 wherein said integral layer of hydrogenated amorphous silicon comprises one or more of the silicon hydride phases selected from the group consisting of Si:H, Si:H$_2$, and Si:H$_3$.

12. A semiconductor device made in accordance with the method recited in claim 1.

* * * * *